(12) United States Patent
Meyer

(10) Patent No.: US 7,518,846 B1
(45) Date of Patent: Apr. 14, 2009

(54) ESD PROTECTION METHOD FOR LOW-BREAKDOWN INTEGRATED CIRCUIT

(75) Inventor: Robert G. Meyer, Berkeley, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 214 days.

(21) Appl. No.: 11/502,914

(22) Filed: Aug. 10, 2006

Related U.S. Application Data

(63) Continuation-in-part of application No. 11/361,810, filed on Feb. 23, 2006, now abandoned.

(51) Int. Cl.
*H02H 9/00* (2006.01)
*H02H 1/00* (2006.01)

(52) U.S. Cl. ........................................ 361/56
(58) Field of Classification Search ................ 361/56
See application file for complete search history.

(56) References Cited

U.S. PATENT DOCUMENTS

| | | | | |
|---|---|---|---|---|
| 5,825,601 | A * | 10/1998 | Statz et al. ................ | 361/56 |
| 5,946,177 | A * | 8/1999 | Miller et al. .............. | 361/56 |
| 6,862,160 | B2 * | 3/2005 | Maloney et al. ........... | 361/56 |
| 2002/0153571 | A1 * | 10/2002 | Mergens et al. ........... | 257/358 |
| 2003/0201457 | A1 * | 10/2003 | Lin et al. ................... | 257/173 |
| 2004/0027742 | A1 * | 2/2004 | Miller et al. .............. | 361/52 |
| 2004/0109270 | A1 * | 6/2004 | Stockinger et al. ........ | 361/56 |

OTHER PUBLICATIONS

W.D. Mack and R.G. Meyer, "New ESD Protection Schemes for BiCMOS Process with Applications to Cellular Radio Design", IEEE ISCAS Proceedings, May 1992, pp. 2699-2702.
M. Stockinger, J.W. Miller, M.G. Khazhinsky, C.A. Torres, J.C. Weldon, B.D. Preble, M.J. Bayer, M. Akers, V.G. Kamat, Motorola, "Boosted and Distributed Rail Clamp Networks for ESD Protection in Advanced CMOS Technologies", EOS/ESD Symposium Proceedings, 2003, no month.

* cited by examiner

Primary Examiner—Ronald W Leja
(74) Attorney, Agent, or Firm—Haverstock & Owens LLP

(57) ABSTRACT

An ESD protection device has a multi-stage RC-timed architecture to turn on quickly and sink current for a relatively long time period. For example, a high power voltage clamp and a low power voltage clamp coupled in parallel to protect internal circuitry of an integrated circuit. The high power clamp turns on during the first few microseconds of an ESD event, and sinks current for a brief period of time, during which the low power clamp turns on as well. Once the high power clamp turns off, the low power clamp continues to sink current until a safe level is reached.

14 Claims, 3 Drawing Sheets

ESD PROTECTION METHOD FOR LOW-BREAKDOWN INTEGRATED CIRCUIT

RELATED APPLICATION

This patent application is a continuation-in-part of U.S. patent application Ser. No. 11/361,810, filed Feb. 23, 2006 now abandoned and entitled "ESD PROTECTION METHOD FOR LOW-BREAKDOWN INTEGRATED CIRCUIT", the contents of which are hereby incorporated by reference in their entirety.

FIELD OF THE INVENTION

The present invention relates generally to devices for protecting circuits from various electrical transients, and more particularly to devices for protecting integrated circuits from electrostatic discharge.

BACKGROUND

Integrated circuits (ICs) typically include external connections for receiving power supply voltages, control or communication signals from external devices and systems. To accommodate demand for computing devices of increasingly smaller size, the internal circuit density of ICs must also increase. In addition, to accommodate demand for low power-consuming devices, power supply potentials used to operate ICs also continues to decrease.

These two trends increase sensitivity of ICs to the effects of electrostatic discharge. Electrostatic discharge (ESD) refers to the discharge of a short burst of high current that results from a build up of static charge on a package, or on a human handling that an IC package. ESD can destroy the internal circuitry of an IC, and hence is a serious concern. Because ESD is so prevalent, IC designers have attempted to integrate ESD protection mechanisms or circuits into their products.

One solution employs a "snap-back" structure to short an input to ground. This type of structure has two conduction modes. At low (non-ESD) voltages the device operates in normal conduction mode, letting only a low leakage current through. When the device is exposed to a high voltage (ESD) event, it enters a "snap-back" mode and conducts higher current or voltage. Typically, such devices stay in "snap-back" mode until voltage or current drops below a minimum level, whereupon they reenter normal mode. Unfortunately, for very high voltage ESD events, these structures can break down and are thus ineffective at limiting the maximum voltage on the input.

A second type of solution, outlined by W. D. Mack and R. G. Meyer, "New ESD Protection Schemes for BiCMOS Process with Applications to Cellular Radio Design," IEEE ISCAS Proceedings, May 1992, pp. 2699-2702, employs switching transistors to form a switchable conductive circuit between the circuit voltage supply and ground. These transistors are typically turned off during non-ESD events, but activated during an ESD event to provide a discharge path for an ESD current. Typically, the circuit remains active for a period of time dependent on an RC timing circuit (sometimes employing the resistance of the switching transistors themselves).

One variation on this second type is a multiple time-constant electrostatic discharge (ESD) protection scheme as described by M. Stockinger, J. Miller, M. Khazhinsky, C. Torres, J. Weldon, B. Preble and M. Akers, "Boosted and Distributed Rail Clamp Networks for ESD Protection in Advanced CMOS Technologies," IOS/ESD Symposium Proceedings, 2003. This variation fails to protect against slow ESD events. The circuit shown in FIG. 6 of Stockinger includes a dual-time-constant rail clamp architecture where the time constant $R_2C_2$ is set to force the on-time of the clamp to about one microsecond. After the on-time has passed, the clamp turns off, leaving no protection against longer-lasting ESD events. Since in practice ESD events can last tens of microseconds, a one microsecond on-time is insufficient to provide full protection against real world ESD. The naïve solution of simply extending the on-time of the clamp of FIG. 6 by increasing the $R_2C_2$ time constant to several tens of microseconds would create another problem by allowing the high-current ESD clamp to stay on for an excessive period of time during normal power-up of the circuit. Since the high current clamp draws high current while it is on, running it for several tens of microseconds during each normal power up would decrease efficiency of the circuit. In fact, the scheme in FIG. 6 of Stockinger includes features designed to prevent even short-time (one microsecond) turn on of the clamp during slower events such as normal power-up. A second time constant, set by the product RC, which is typically in the nanosecond range, provides this functionality. However this feature prevents the whole clamp from protecting against slower ESD events.

These types of RC-timed triggered circuits are effective against certain types of ESD events, e.g. fast, high powered ones, but cannot protect against ESD events of more than a few microseconds in duration, or those that include both fast, high powered transients and also slow acting ones. A clamp that provides ESD protection against both fast and slow transients will enhance manufacturing yields and could be a major advantage in the market, as customers demand increasing levels of protection.

SUMMARY

The present invention relates to a new approach to overcome the limitations of the prior art. In general, the present invention includes embodiments that use multi-stage RC-timed architectures to turn on quickly and sink current for a relatively long time period. In contrast to the prior art described above, a two-clamp scheme in accordance with the present invention protects against both fast ESD events, e.g. those lasting less than one microsecond, and also against longer events, e.g. those lasting around 50 microseconds. The two-clamp approach described herein avoids the efficiency problems that would be created by using a high current clamp with a long time constant, by limiting the high current pulse from its high-current clamp during normal power-up to a relatively short time, e.g. about 1 microsecond at several amperes, after which the low current clamp takes over for long term ESD protection, e.g. drawing about 200 microamperes for 50 microseconds.

An electrostatic discharge protection device in accordance with the embodiments of the present invention includes at least two voltage clamps. For example, one embodiment comprises an RC-timed high current voltage clamp configured to switch on during an ESD event and discharge a first level of ESD-generated current to ground until the RC-timed high current voltage clamp switches off, wherein the RC-timed high current voltage clamp is configured to switch off after a first time; and an RC-timed low current voltage clamp coupled to the RC-timed high current voltage clamp in parallel, and configured to switch on during the first time and to discharge a second level of ESD-generated current to ground until the RC-timed low current voltage clamp switches off, wherein the RC-timed low current voltage clamp is configured to switch off after a second time greater than the first time.

In the preferred embodiment, an ESD protection device in accordance with the present invention is a high current supply voltage clamp that turns on during an ESD event and conducts ESD current (on the order of amps) to ground with only 2-3 volts developed across the terminals. In this preferred embodiment, the voltage clamp is arranged to protect internal circuitry that operates with up to 4 volts of DC supply. As such, the voltage clamp is preferably AC coupled to the internal circuitry, allowing it to sink AC components of ESD events without unduly affecting the DC supply voltage. This embodiment includes two clamps coupled in parallel. One clamp discharges high current (4A or more) for about 1 microsecond and then turns off. The second parallel clamp is much smaller and conducts up to 200 milliamps for 100 microseconds to discharge long events. This arrangement provides a very low "on" voltage of 2 to 3 volts that protects low-voltage circuits, while the long (100 microseconds) total duration of protection guards against slow ESD events.

The present invention also includes methods related to protecting circuitry from damage by ESD events. For example, in one embodiment a method of preventing an electrostatic discharge (ESD) event from damaging an internal circuit of an integrated circuit device is presented. This method comprises the steps: turning on a first current sinking circuit capable of sinking a first level of current; discharging a first portion of the ESD event to ground through the first current sinking circuit during a first time; also during the first time, turning on a second current sinking circuit capable of sinking a second level of current, lower than the first level of current; turning off the first current sinking circuit; and discharging a second portion of the ESD event to ground through the second current sinking circuit during a second time.

DETAILED DESCRIPTION

The following detailed description includes numerous specific details to help provide a thorough understanding of the invention. It should be understood by those skilled in the art that systems and devices included in the present invention need not include all of these specific details. In addition, to focus the detailed description on the invention itself, methods, procedures, components and circuits generally well known to those skilled in the art are not described in detail.

The following description and claims use the terms "coupled with", "coupled to" and "connected," along with their derivatives. These terms are not intended as synonyms for each other. Rather, in particular embodiments, elements described as "connected" are understood to be in direct physical or electrical contact with each other. "Coupled" has multiple meanings: it can indicate that two or more elements are in direct physical or electrical contact; however, "coupled" can also indicate that the elements are not in direct contact with each other, but interact with each other in some other way.

Figure 1:
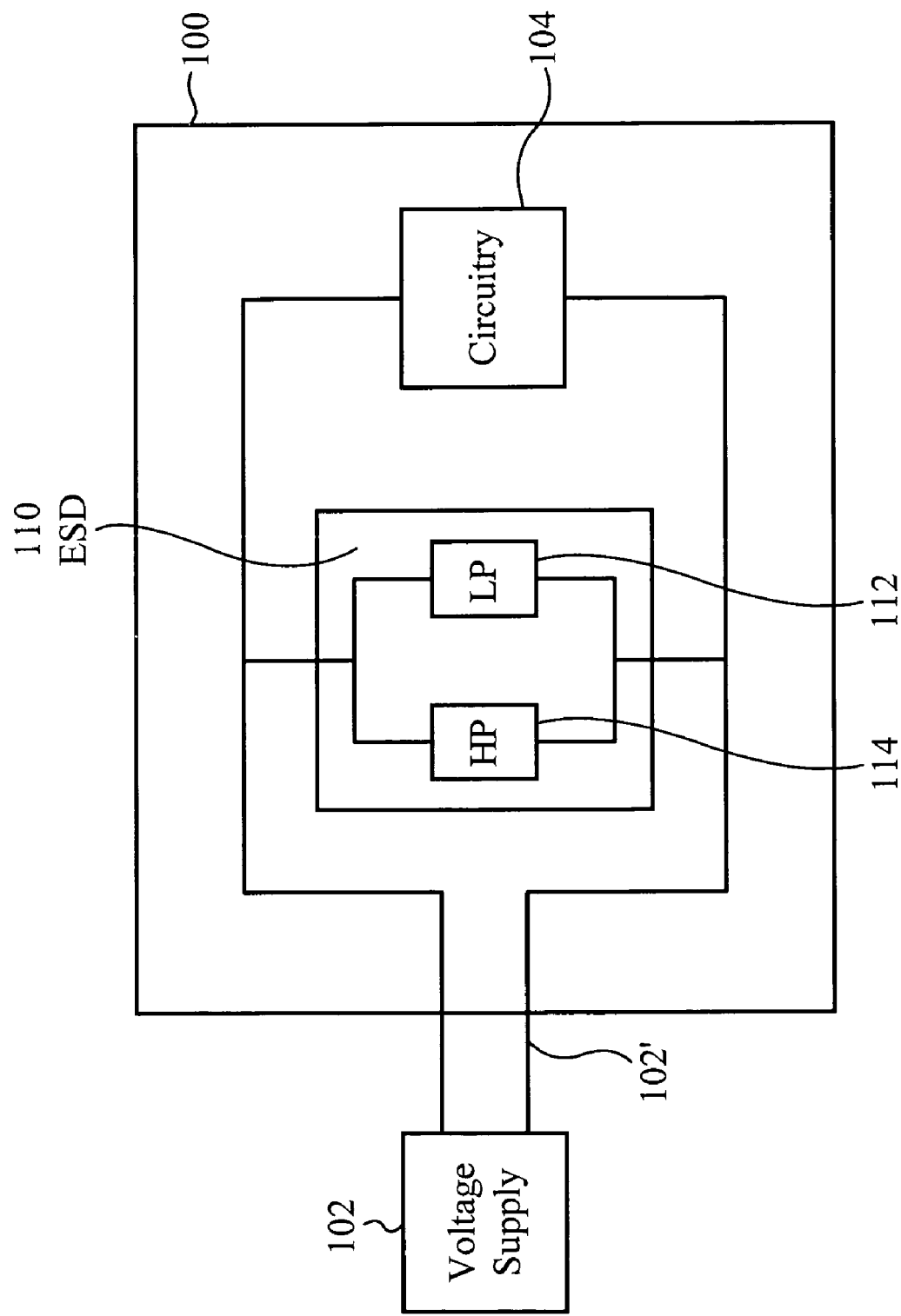
FIG. 1 is a block diagram of an integrated circuit in accordance with an embodiment of the present invention.

In a particular embodiment of the present invention, ESD circuitry is included in an integrated circuit. FIG. 1 is a block diagram of an integrated circuit 100, which has a voltage supply input 102' for receiving a supply voltage from supply circuit 102. Two-stage ESD protection circuit 110 protects circuitry 104 from electrostatic discharge. Here, the two-stage ESD protection circuit includes a high power sub-circuit 114 and a low power sub-circuit 110. Various embodiments of the protection circuitry are described in detail below.

The integrated circuit 100 may include any type of circuitry, analog or digital, that receives a supply voltage, including, but not limited to, processors, controllers, memories, and application specific integrated circuits (ASIC). In addition, it should be understood that the integrated circuit 100 might be combined with other types of integrated circuits to provide systems offering greater functionality. Of course, the scope of the present invention is not intended to be limited in this respect.

General Function

During an ESD event, where high voltage is developed across the inputs 102', the ESD protection circuit 110 limits the voltage developed across the circuitry 104. In order to protect the circuitry 104 against a wide variety of ESD events, including relatively slow low voltage ESD events as well as short, high intensity events, the parallel construction of the ESD protection circuit 110 permits inclusion of specialized sub-circuits to handle different aspects of an event. When the IC 100 experiences an ESD event, e.g. 2000 to 3000 volts human body model (HBM) ESD, the high power sub-circuit 114 turns on quickly, e.g. within a few hundred nanoseconds, and grounds ESD current for a short period of time, e.g. 1 to 2 microseconds, before turning off. During this time, the high power sub-circuit 114 sinks a large proportion of the ESD generated current, e.g. up to 4 amps. Also during this time, the low power sub-circuit 112 turns on and grounds ESD current for a much longer period of time, e.g. 100 microseconds, but at a lower current, e.g. 200 milliamps.

In this manner, both low voltage and high voltage components of an ESD event are handled over a period of time. This arrangement can provide both a very low "on" voltage, e.g. 2-3 volts, protecting low-voltage circuits, and a relatively long total duration to guard against slow ESD events. In the preferred embodiment of the present invention, the ESD protection circuit is AC coupled to the inputs to permit higher DC supply voltages while simultaneously protecting against relatively lower voltage (AC components) of ESD events.

The specifics of the preferred embodiment described below are in some ways particular to the protection of a radio frequency circuit requiring minimal interference from its ESD-protective circuitry. In other applications, specific component sizes, capabilities and configurations would differ accordingly.

High Power

Figure 2:
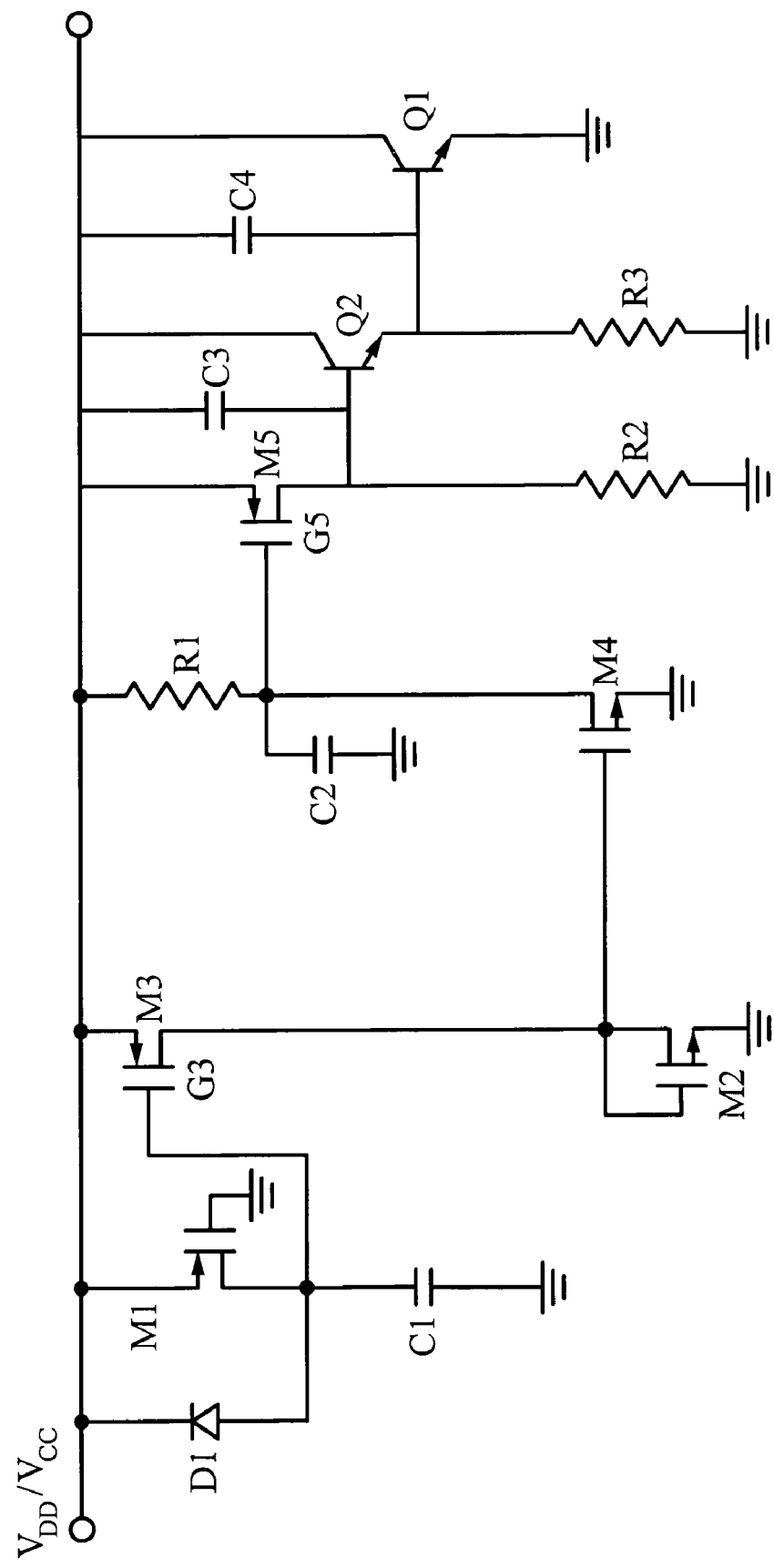
FIG. 2 illustrates a high current voltage clamp in accordance with the preferred embodiment of the present invention.

FIG. 2 illustrates the preferred embodiment of a high power sub-circuit according to the present invention. The sub-circuit is coupled to Vcc/Vdd input through multiple means.

The sub-circuit includes a fast acting current-sinking portion and a timing portion. The timing portion includes the diode D1, which is coupled in parallel with the triode-mode transistor M1 to Vcc/Vdd both of which are connected to the pull-down capacitor C1 and thereby AC coupled to ground. The triode mode transistor M1 preferably operates as a mega-ohm resistor. The pull-down capacitor C1 is also connected to the control terminal G3 of the switching transistor M3. The source of M3 is coupled to Vcc/Vdd, the drain of M3 is coupled to the gate and drain of the switching transistor M2 and also to the gate of the switching transistor M4. The source terminals of both switching transistor M2 and M4 are connected to ground.

The sinking portion includes the switching transistor M5, which has a source coupled to Vcc/Vdd as well as a gate G5 coupled to Vcc/Vdd through pull-up resistor R1 and to ground through pull-down capacitor C2. In addition, G5 is coupled to the drain terminal of switching transistor M4. The drain terminal of transistor M5 is coupled to ground through pull-down resistor R2, to Vcc/Vdd through pull-up capacitor C3, and to the base terminal of sinking transistor Q2.

The base terminal of transistor Q2 is also coupled to Vcc/Vdd through pull-up capacitor C3 and grounded through pull down resistor R2. Its collector terminal is connected to Vcc/Vdd and its emitter terminal is grounded through pull-down resistor R3. The emitter terminal of Q2 also connects with the base terminal of sinking transistor Q1 as well as with pull-up capacitor C4. The base of transistor Q1 is coupled to Vcc/Vdd through pull-up capacitor C4. The collector of Q1 is connected to Vcc/Vdd, and its emitter is grounded.

Preferably, the various resistances and capacitances of the components of the high power sub-circuit illustrated in FIG. 2 are chosen so that the sub-circuit behaves as described below during an ESD event of 2000 to 3000 volts.

When the ESD event takes Vdd high, pull-down capacitor C1 clamps G3 to ground and turns on switching transistor M3. Meanwhile, pull-down capacitor C2 clamps G5 to ground and turns on switching transistor M5. On the fast leading edge, C3 and C4 dump charge into sinking transistors Q2 and Q1 for sub-microsecond turn on of Q1, which is sized for the maximum current desired, preferably 2-4 amps. Switching transistor M5 holds Q1 and Q2 on until pull-down capacitor C1 charges up in 1 to 2 microseconds and turns off M3. The turn off of transistor M3 cascades through switching transistors M2 and M4, turning off M5, which turns off Q2 and subsequently Q1. Following turn-off, capacitor C1 discharges through diode D1.

Low Power

Figure 3:
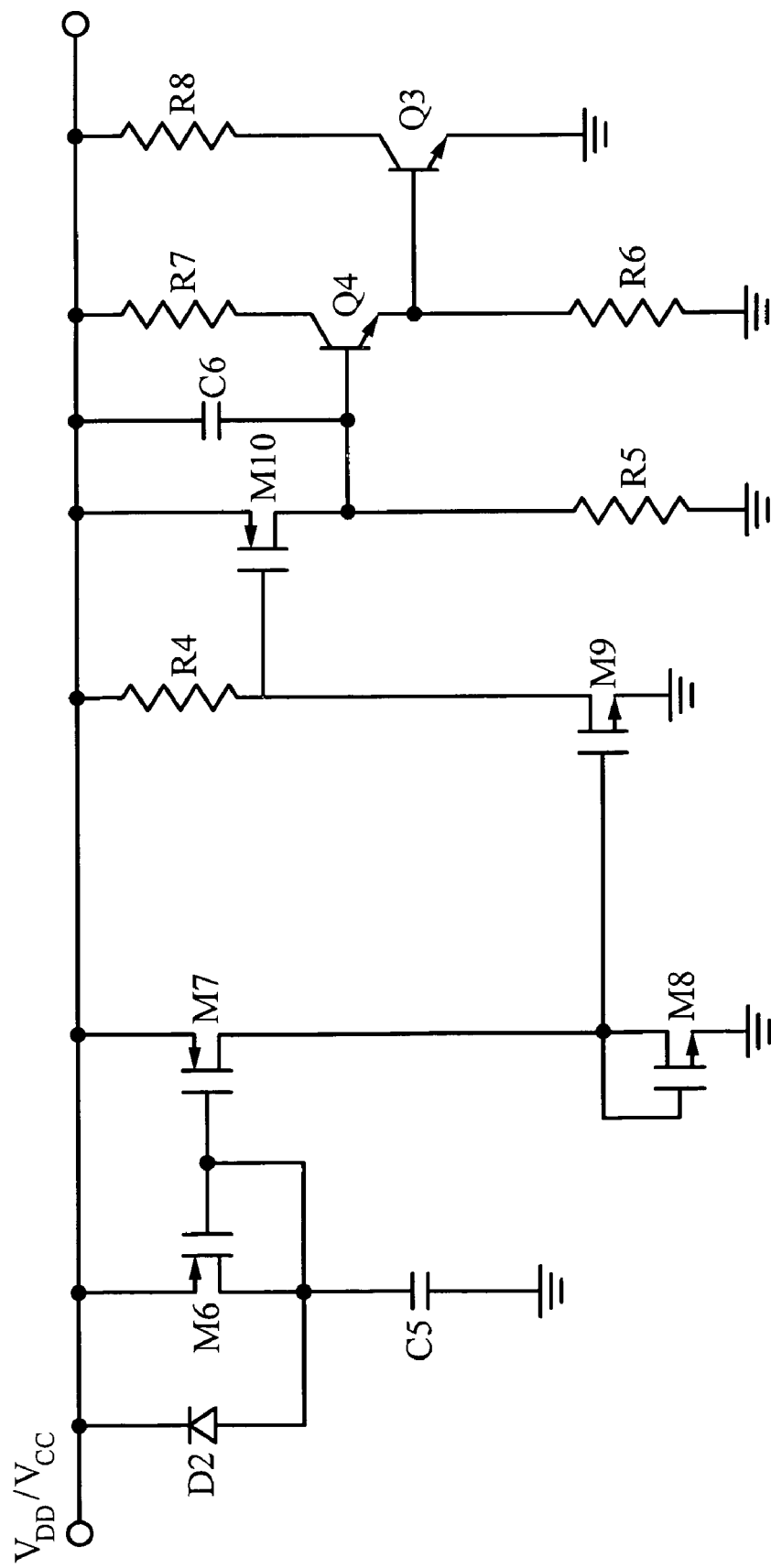
FIG. 3 illustrates a low current voltage clamp in accordance with the preferred embodiment of present invention.

FIG. 3 illustrates the preferred embodiment of a low power sub-circuit according to the present invention. The sub-circuit is coupled to Vcc/Vdd input through multiple means.

The sub-circuit includes a current-sinking portion and a timing portion. The timing portion includes the diode D2, which is coupled in parallel with the saturation-mode transistor M6 to Vcc/Vdd both of which are connected to the pull-down capacitor C5 and thereby AC coupled to ground. The saturation-mode transistor M6 is gate-source coupled to ground through the pull down capacitor C5, and also to the gate of switching transistor M7. The source of M7 is coupled to Vcc/Vdd; the drain of M7 is coupled to the gate and drain of the switching transistor M8 and also to the gate of the switching transistor M9. The source terminals of both switching transistor M8 and M9 are connected to ground.

The sinking portion includes the switching transistor M10, which has a source coupled to Vcc/Vdd as well as a gate coupled to Vcc/Vdd through pull-up resistor R4. In addition, the gate of M10 coupled to the drain terminal of switching transistor M9. The drain terminal of transistor M10 is coupled to ground through pull-down resistor R5, to Vcc/Vdd through pull-up capacitor C6, and to the base terminal of sinking transistor Q4. The base terminal of transistor Q4 is also coupled to Vcc/Vdd through pull-up capacitor C6 and grounded through pull down resistor R5. Its collector terminal is coupled to Vcc/Vdd through resistor R7 and its emitter terminal is grounded through pull-down resistor R6. The emitter terminal of Q4 also connects with the base terminal of sinking transistor Q3. The collector of Q1 is coupled to Vcc/Vdd through resistor R8, and its emitter is grounded. In accordance with the present invention, the low power sub-circuit connects in parallel to the high power sub-circuit.

Preferably, the various resistances and capacitances of the components of the low power sub-circuit illustrated in FIG. 3 are chosen so that the sub-circuit behaves as described below during an ESD event of 2000 to 3000 volts. However, the general architecture described herein in accordance with the present invention can protect circuitry from ESD events of at least 15 kilovolts. The preferred embodiment is configured to protect only against lower voltage ESD events in order to cause less performance degradation in an integrated circuit that functions at radio frequencies.

When the ESD event takes Vdd high, the low power sub-circuit takes longer to turn on than the high power sub-circuit. This is largely due to the slower turn-on of switching transistor M10 and the subsequently slower turn-on of the sinking transistors Q3 and Q4. Initially, pull-down capacitor C5 pulls the gate of switching transistor M7 low, turning on M7. This subsequently turns on M8 and M9, allowing the gate of switching transistor M10 to be pulled low and turning on M10. This turns on sinking transistor Q4 and subsequently Q3, which is sized for the maximum current desired, preferably 200 milliamps. Resistors R7 and R8 limit the current in the low power clamp to this preferred level. Switching transistor M10 holds Q3 and Q4 on until pull-down capacitor C5 charges up in 50 to 100 microseconds and turns off M7. The turn off of transistor M7 cascades through switching transistors M8 and M9, turning off M10, which turns off Q4 and subsequently Q3. Following turn-off, capacitor C5 discharges through diode D2.

Together, the low power and high power sub-circuits clamp Vdd to a maximum of 2-3V from 0 to 100 microseconds.

In the preferred embodiment, M6 operates in saturation mode. The drain current in M6 falls to the milliamp range when the difference between the gate-source voltage of M6 and its threshold voltage is around 0.2 volts. Preferably, devices are sized so that M10 turns off after around 100 microseconds. Of course, in any device timing is process and temperature dependent, but in any case the preferred configuration sets the channel width/length ratios of M6 and M1 to give turn-off at minimums of 100 microseconds for the low power sub-circuit and 1 microsecond for the high power sub-circuit. In this case, maximum values will be around 200 to 300 microseconds and 2 to 3 microseconds respectively. This additional duration will provide extra protection, and should not diminish performance. In addition, the inclusion of resistors R7 and R8 in the low power sub-circuit limit current in the current sinking transistors Q3 and Q4 during regular circuit turn-on, e.g. Vcc 4 volts, to around 400 milliamps for about 100 microseconds.

EXAMPLES

To perform tests of the above-described sub-circuits, two test circuits were simulated. Their characteristics are listed in Table 1.

In other embodiments, for example those seeking to protect against larger ESD voltages, M5 and C2 are larger for additional current capability. In addition, in some embodiments the size of C4 is reduced to save area.

TABLE 1

| | High Power | | Low Power |
|---|---|---|---|
| C1 | 1 pF | C5 | 1 pF |
| C2 | 1 pF | C6 | 1 pF |
| C3 | 1 pF | R7 | 50 phm |
| C4 | 5 pF | R8 | 10 ohm |
| M1 | .5/20 (w/l) | M6 | .42/150 |
| M3 | 9/.35 | M7 | 35/.35 |
| M2 | 2.8/.35 | M8 | 2.8/.35 |
| M4 | 42/.35 | M9 | 42/.35 |
| M5 | 100/.35 | M10 | 70/.35 |
| R2 | 4000 ohm | R5 | 4000 ohm |
| R3 | 300 ohm | R6 | 300 ohm |
| Q1 | Sized for 2-4 amps | Q3 | Sized for 200 mA |
| Q2 | 1/10 area (Q1) | Q4 | 1/10 area (Q3) |

Example 1

In simulation, an ESD protection circuit comprising a low power sub-circuit and a high power sub-circuit of the above-discussed designs, connected in parallel, was exposed to HBM type ESD. The ESD event had the following characteristics: capacitance 100 picofarads, resistance of 1.5 kilohms, voltage 3 kilovolts, initial current 2 amps, time constant 150 microseconds.

This setup yielded 2 milliamps of current after 1 microsecond, the high power sub-circuit turned off and the low power sub-circuit continued to discharge the current for 100 microseconds. Current fell to 4 picoamps after 3 microseconds.

Example 2

In simulation, an ESD protection circuit comprising a low power sub-circuit and a high power sub-circuit of the above-discussed designs, connected in parallel, was exposed to HBM type ESD. The ESD event had the following characteristics: capacitance 100 picofarads, resistance of 50 kilohms, voltage 3 kilovolts, initial current 60 milliamps, time constant 5 milliseconds.

This setup yielded 60 milliamps of current after 1-2 microseconds, the high power sub-circuit turned off and the low power sub-circuit continued to discharge the current for 100 microseconds. Current fell to 123 picoamps after 100 microseconds and voltage was 1 volt.

Example 3

In simulation, an ESD protection circuit comprising a low power sub-circuit and a high power sub-circuit of the above-discussed designs, connected in parallel, was exposed to HBM type ESD. The ESD event had the following characteristics: capacitance 100 picofarads, resistance of 100 kilohms, voltage 3 kilovolts, initial current of 30 milliamps, and time constant 10 milliseconds.

This setup yielded current of around 60 picoamps after 100 microseconds with 1 volt of voltage.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention.

The invention claimed is:

1. An electrostatic discharge (ESD) protection device, comprising:
   a. an RC-timed high current voltage clamp configured to switch on during an
   ESD event and discharge a first level of ESD-generated current to ground until the RC-timed high current voltage clamp switches off, wherein the RC-timed high current voltage clamp is configured to switch off after a first time; and
   b. an RC-timed low current voltage clamp coupled to the RC-timed high current voltage clamp in parallel, and configured to switch on during the first-time and to discharge a second level of ESD-generated current to ground until the RC-timed low current voltage clamp switches off, wherein the RC-timed low current voltage clamp is configured to switch off after a second time greater than the first time.

2. The ESD protection device of claim 1, wherein the first time is between 1 and 3 microseconds.

3. The ESD protection device of claim 1, wherein the second time is between 50 and 150 microseconds.

4. The ESD protection device of claim 1, wherein the first level is 4 amps.

5. The ESD protection device of claim 1, wherein the second level is 200 milliamps.

6. An integrated circuit having circuitry, inputs, and an electrostatic discharge (ESD) protection circuit, the ESD protection circuit comprising:
   a. a high current voltage clamp coupled in parallel across the circuitry of the integrated circuit, comprising:
      i. a first pull-down capacitor with a first terminal coupled to ground and a second terminal coupled with the inputs;
      ii. a first switching transistor with a control terminal coupled to the first capacitor, a source terminal coupled to the inputs, and a drain terminal coupled with ground;
      iii. a second pull-down capacitor with a first terminal coupled to ground and a second terminal coupled with the inputs;
      iv. a second switching transistor with a control terminal coupled to the second capacitor and controlled by the drain terminal of the first switching transistor, a source terminal coupled to the inputs, and a drain terminal coupled with ground;
      v. a first pull-up capacitor with a first terminal coupled to the inputs and a second terminal coupled with ground; and
      vi. a first sinking transistor with a control terminal coupled to the second terminal of the first pull-up capacitor and to the drain terminal of the second switching transistor, a collector terminal coupled to the inputs, and an emitter terminal coupled with ground;
   b. a low current voltage clamp coupled in parallel to the circuitry of the integrated circuit, comprising:
      i. a first pull-down capacitor with a first terminal coupled to ground and a second terminal coupled with the inputs;
      ii. a first switching transistor with a control terminal coupled to the first capacitor, a source terminal coupled to the inputs, and a drain terminal coupled with ground;
      iii. a second switching transistor with a control terminal controlled by the drain terminal of the first switching transistor, a source terminal coupled to the inputs, and a drain terminal coupled with ground; and iv. a first sinking transistor with a control terminal coupled to the second terminal of the first pull-up capacitor and to the drain terminal of the second switching transistor, a collector terminal coupled to the inputs, and an emitter terminal coupled with ground.

7. The integrated circuit of claim 6, wherein the high current voltage clamp further comprises:

a. a second pull-up capacitor with a first terminal coupled to the inputs and a second terminal coupled with ground;

b. a second sinking transistor with a control terminal coupled to the emitter terminal of the first sinking transistor and to the second terminal of the second pull-up capacitor, a collector terminal coupled to the inputs, and an emitter terminal coupled to ground.

8. The integrated circuit of claim 6, wherein the low current voltage clamp further comprises:

a. a triode-mode capacitor with a source terminal coupled to the inputs, and a drain and a control terminal coupled to the second terminal of the first pull-down capacitor.

9. A method of preventing an electrostatic discharge (ESD) event from damaging an internal circuit of an integrated circuit device, comprising the steps:

a. turning on a first current sinking circuit capable of sinking a first level of current;

b. discharging a first portion of the ESD event to ground through the first current sinking circuit during a first time;

c. also during the first time, turning on a second current sinking circuit capable of sinking a second level of current, lower than the first level of current;

d. turning off the first current sinking circuit; and e. discharging a second portion of the ESD event to ground through the second current sinking circuit during a second time.

10. The method of claim 9, wherein the first level of current is 4 amps.

11. The method of claim 9, wherein the second level of current is 200 milliamps.

12. The method of claim 9, wherein the first time is 2 microseconds.

13. The method of claim 9, wherein the second time is 100 microseconds.

14. The method of claim 9, further comprising a step of turning off the second current sinking circuit.

* * * * *